(12) United States Patent
Jang

(10) Patent No.: US 9,847,440 B2
(45) Date of Patent: Dec. 19, 2017

(54) TEMPERATURE CONTROL SYSTEM FOR SOLAR CELL MODULE

(71) Applicant: LSIS CO., LTD., Anyang-si, Gyeonggi-do (KR)

(72) Inventor: Sung Jin Jang, Seoul (KR)

(73) Assignee: LSIS CO., LTD., Anyang-si (KR)

( * ) Notice: Subject to any disclaimer, the term of this patent is extended or adjusted under 35 U.S.C. 154(b) by 585 days.

(21) Appl. No.: 14/327,311

(22) Filed: Jul. 9, 2014

(65) Prior Publication Data

US 2015/0027511 A1    Jan. 29, 2015

(30) Foreign Application Priority Data

Jul. 23, 2013  (KR) .......................... 10-2013-0086976

(51) Int. Cl.
*H01L 31/052*     (2014.01)
*H02S 50/00*      (2014.01)
(Continued)

(52) U.S. Cl.
CPC ....... *H01L 31/0521* (2013.01); *G05D 7/0623* (2013.01); *G05D 7/0676* (2013.01);
(Continued)

(58) Field of Classification Search
CPC .................................................... H01L 31/042
(Continued)

(56) References Cited

U.S. PATENT DOCUMENTS 4,626,832 A * 12/1986 Farrington ............. G08B 23/00
340/500
5,086,269 A *  2/1992 Nobi ........................ G01R 1/04
324/750.07
(Continued)

FOREIGN PATENT DOCUMENTS

CN         2859897 Y        1/2007
CN     101821509 A  *   9/2010  .............. F04B 35/04
(Continued)

OTHER PUBLICATIONS

The State Intellectual Property Office of the People's Republic of China Application Serial No. 201410350190.X, Office Action dated Mar. 2, 2016, 8 pages.
(Continued)

*Primary Examiner* — Gail Kaplan Verbitsky
(74) *Attorney, Agent, or Firm* — Lee, Hong, Degerman, Kang & Waimey

(57) ABSTRACT

An aspect of present invention is to provide a temperature control system for a solar cell module, capable of controlling a solar cell module to maintain a proper temperature, the temperature control system comprises: a temperature sensor configured to measure a temperature of the solar cell module; a fluid tube having therein a path along which a temperature controlling fluid flows; a pump configured to supply a temperature controlling fluid which flows along the fluid tube; and an inverter configured to drive the pump such that the temperature controlling fluid is supplied, if the current temperature of the solar cell module is not lower than
(Continued)

the pre-stored first pump driving reference temperature, or if the current temperature of the solar cell module is not higher than the pre-stored second pump driving reference temperature.

10 Claims, 6 Drawing Sheets

(51) Int. Cl.
- *G05D 7/06* (2006.01)
- *G05D 23/19* (2006.01)
- *H02S 40/42* (2014.01)
- *H01L 31/042* (2014.01)
- *H02S 20/32* (2014.01)

(52) U.S. Cl.
CPC ....... *G05D 23/1919* (2013.01); *H01L 31/042* (2013.01); *H02S 20/32* (2014.12); *H02S 40/425* (2014.12); *H02S 50/00* (2013.01); *Y02E 10/50* (2013.01)

(58) Field of Classification Search
USPC ................ 320/243, 252; 374/141, 178, 4, 5; 136/246, 243, 252, 253
See application file for complete search history.

(56) References Cited

U.S. PATENT DOCUMENTS

| | | | | |
|---|---|---|---|---|
| 6,111,767 | A * | 8/2000 | Handleman | G05F 1/67 136/293 |
| 8,916,765 | B2 * | 12/2014 | Kim | H01L 31/042 136/246 |
| 9,027,248 | B2 * | 5/2015 | Flaherty | H01L 31/0521 29/890.03 |
| 9,539,880 | B2 * | 1/2017 | Inaba | B60H 1/00899 |
| 2009/0043429 | A1 * | 2/2009 | Minekawa | F01P 5/04 701/1 |
| 2010/0000594 | A1 * | 1/2010 | Zalusky | H01L 31/052 136/246 |
| 2010/0073011 | A1 * | 3/2010 | Svidenko | G01J 1/02 324/537 |
| 2010/0229585 | A1 * | 9/2010 | Bradford | F24F 1/0003 62/291 |
| 2011/0048502 | A1 * | 3/2011 | Kikinis | F24D 11/0221 136/248 |
| 2012/0090663 | A1 * | 4/2012 | Kiesewetter | F28D 20/0052 136/248 |
| 2012/0318328 | A1 * | 12/2012 | Boyle | F24J 2/055 136/248 |
| 2013/0061910 | A1 * | 3/2013 | Almogy | F24D 11/003 136/248 |
| 2013/0076382 | A1 | 3/2013 | Park et al. | |
| 2013/0112237 | A1 * | 5/2013 | Almogy | F24J 2/38 136/246 |
| 2013/0116871 | A1 * | 5/2013 | Hashimoto | B60L 11/1803 701/22 |
| 2013/0269756 | A1 * | 10/2013 | Pao | H01L 31/0483 136/248 |
| 2014/0026945 | A1 * | 1/2014 | Correia | H01L 31/18 136/248 |
| 2015/0000723 | A1 * | 1/2015 | Cheng | H02S 40/425 136/248 |
| 2016/0141879 | A1 * | 5/2016 | Motsenbocker | G05F 1/67 307/18 |
| 2016/0183408 | A1 * | 6/2016 | Sutherland | F25D 17/02 62/93 |
| 2016/0218667 | A1 * | 7/2016 | Kiesewetter | F28D 20/0052 |
| 2017/0272031 | A1 * | 9/2017 | Yuque | H02S 40/425 |

FOREIGN PATENT DOCUMENTS

| | | | | |
|---|---|---|---|---|
| CN | 101902175 | A * | 12/2010 | |
| CN | 101980374 | | 2/2011 | |
| CN | 102364695 | | 2/2012 | |
| CN | 102774916 | A * | 11/2012 | |
| CN | 202867123 | U * | 4/2013 | |
| CN | 103151945 | A * | 6/2013 | |
| DE | 19923196 | | 4/2000 | |
| DE | 10-2004-043205 | | 3/2006 | |
| DE | 102004043205 | | 3/2006 | |
| DE | 102004043205 | A1 * | 3/2006 | ............. H02S 20/24 |
| DE | 102007055462 | A1 * | 5/2009 | ........... H01L 31/052 |
| DE | 102008049538 | A1 * | 4/2010 | ................ F24J 2/08 |
| DE | 1020008064313 | A1 * | 7/2010 | |
| EP | 1912262 | A1 * | 4/2008 | ......... H01L 31/0521 |
| FR | 2974670 | | 11/2012 | |
| JP | 57153531 | A * | 3/1981 | |
| JP | 63174114 | A * | 7/1988 | |
| JP | 06-265218 | | 9/1994 | |
| JP | 07-240532 | | 9/1995 | |
| JP | 09-060980 | | 3/1997 | |
| JP | 09232618 | A * | 9/1997 | |
| JP | 10-201268 | | 7/1998 | |
| JP | 2002-170974 | | 6/2002 | |
| JP | 2006-228481 | | 8/2006 | |
| JP | 2007-272639 | | 10/2007 | |
| JP | 2011-214362 | | 10/2011 | |
| JP | 5112130 | B2 * | 1/2013 | |
| KR | 10-2009-0119647 | | 11/2009 | |
| KR | 2012006679 | A * | 1/2012 | |
| KR | 101162747 | B1 * | 7/2012 | |
| KR | 2013071830 | A * | 1/2013 | |
| KR | 20140097776 | A * | 8/2014 | |
| KR | 2013071830 | A * | 1/2017 | |
| SU | 1836668 | A3 * | 8/1993 | |
| WO | 00/08690 | | 2/2008 | |
| WO | 2008/143182 | | 11/2008 | |
| WO | 2008/143482 | | 11/2008 | |
| WO | WO 2010056777 | A1 * | 5/2010 | ............ H02M 7/003 |
| WO | 2010/138606 | | 12/2010 | |

OTHER PUBLICATIONS

The State Intellectual Property Office of the People's Republic of China Application Serial No. 201410350190.X, Office Action dated Aug. 17, 2016, 8 pages.
Korean Intellectual Property Office Application Serial No. 10-2013-0086976, Office Action dated Oct. 11, 2016, 4 pages.
European Patent Office Application Serial No. 14176987.7, Search Report dated Oct. 2, 2015, 9 pages.
Japan Patent Office Application Serial No. 2014-147362, Office Action dated Sep. 8, 2015, 3 pages.
Japan Patent Office Application Serial No. 2014-147362, Office Action dated May 7, 2015, 3 pages.

* cited by examiner

TEMPERATURE CONTROL SYSTEM FOR SOLAR CELL MODULE

CROSS-REFERENCE TO RELATED APPLICATION

Pursuant to 35 U.S.C. §119(a), this application claims the benefit of earlier filing date and right of priority to Korean Application No. 10-2013-0086976, filed on Jul. 23, 2013, the contents of which are all hereby incorporated by reference herein in its entirety.

BACKGROUND OF THE DISCLOSURE

1. Field of the Disclosure

The present disclosure relates to a photovoltaic system, and particularly, to a temperature control system for a solar cell module in the photovoltaic system.

2. Background of the Disclosure

As can be seen from FIG. 1, a photovoltaic system 100 according to a conventional art comprises a solar cell module 10 configured to convert light energy from the sun into direct-current electric energy; a storage cell 20 configured to charge the direct current converted by the solar cell module 10; an inverter 30 configured to convert the direct current charged in the storage cell 20 into alternating current; and a bidirectional watt-hour meter 40 capable to measure an electric power supply amount of an alternating current provided from the inverter 30 for supplying to a commercial power system, and an electric power usage amount of a commercial alternating current provided from the commercial power system.

Photovoltaic efficiency of the solar cell module 10 is influenced by a solar irradiance amount and an incidence angle. However, since the solar cell module 10 is configured by a semiconductor device, the energy generating efficiency of the solar cell module 10 is high when the solar cell module has a proper temperature, due to characteristics of the semiconductor device. If the solar cell module 10 has a very high temperature or a very low temperature, the photovoltaic efficiency of the solar cell module 10 may be lowered, even if the solar irradiance amount and an incidence angle are optimum.

SUMMARY OF THE DISCLOSURE

Therefore, an aspect of the present disclosure is to provide a temperature control system for a solar cell module, capable of controlling a solar cell module to maintain a proper temperature.

To achieve these and other advantages and in accordance with the purpose of the present disclosure, as embodied and broadly described herein, there is provided a temperature control system for a solar cell module, the system comprising:

a temperature sensor installed at a solar cell module, and configured to measure a temperature of the solar cell module;

a fluid tube installed to contact a rear surface of the solar cell module, and having therein a path along which a temperature controlling fluid flows;

a pump connected to the fluid tube, and configured to supply the temperature controlling fluid which flows along the fluid tube; and an inverter connected to the solar cell module, and configured to convert a direct current provided from the solar cell module into an alternating current, wherein the inverter is electrically connected to the temperature sensor and the pump, wherein the inverter is configured to compare a current temperature of the solar cell module measured by the temperature sensor, with a pre-stored first pump driving reference temperature or a pre-stored second pump driving reference temperature, and wherein the inverter drives the pump for supply of a temperature controlling fluid, if the current temperature of the solar cell module is not lower than the pre-stored first pump driving reference temperature, or if the current temperature of the solar cell module is not higher than the pre-stored second pump driving reference temperature.

According to one aspect of this disclosure, the temperature control system for a solar cell module further comprises a cooling fan electrically connected to the inverter so as to be controlled by the inverter, and configured to blow a cooling air current.

According to another aspect of this disclosure, the cooling fan is installed to blow a cooling air current toward a portion of the fluid tube through which the temperature controlling fluid returns to the pump, such that the temperature controlling fluid to return is cooled.

According to still another aspect of this disclosure, the cooling fan is installed to blow the cooling air current toward the solar cell module, such that the solar cell module is directly cooled.

According to still another aspect of this disclosure, the cooling fan is installed to blow a cooling air current toward the fluid tube provided on a rear surface of the solar cell module, such that the solar cell module is indirectly cooled.

According to still another aspect of this disclosure, the temperature controlling fluid is configured by a cooling fluid or a heating fluid.

According to still another aspect of this disclosure, wherein the temperature controlling fluid is configured by an anti-freezing solution.

According to still another aspect of this disclosure, the temperature control system further comprises a fluid return tank configured to collect therein a returning temperature controlling fluid, and connected to the pump; and a heater configured to heat the temperature controlling fluid inside the fluid return tank.

According to still another aspect of this disclosure, the temperature sensor is one of a platinum resistance temperature detector, a thermistor, a thermocouple and a Resistor Temperature Detector.

Further scope of applicability of the present application will become more apparent from the present disclosure given hereinafter. However, it should be understood that the present disclosure and specific examples, while indicating preferred embodiments of the disclosure, are given by way of illustration only, since various changes and modifications within the spirit and scope of the disclosure will become apparent to those skilled in the art from the present disclosure.

BRIEF DESCRIPTION OF THE DRAWINGS

The accompanying drawings, which are included to provide a further understanding of the disclosure and are incorporated in and constitute a part of this specification, illustrate exemplary embodiments and together with the description serve to explain the principles of the disclosure.

In the drawings.

DETAILED DESCRIPTION OF THE DISCLOSURE

Description will now be given in detail of the exemplary embodiments, with reference to the accompanying drawings. For the sake of brief description with reference to the drawings, the same or equivalent components will be provided with the same reference numbers, and description thereof will not be repeated.

A temperature control system for a solar cell module according to one embodiment of the present invention will be explained in more detail with reference to FIG. 2.

The temperature control system for a solar cell module according to one embodiment of the present invention comprises a temperature sensor 50, a fluid tube 40, a pump 60 and an inverter 30.

Figure 1:
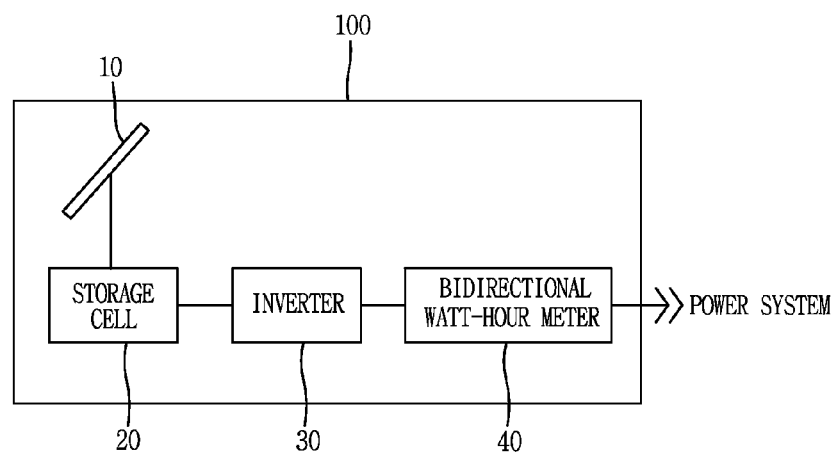
FIG. 1 is a block diagram illustrating a configuration of a photovoltaic system in accordance with the related art.
Figure 2:
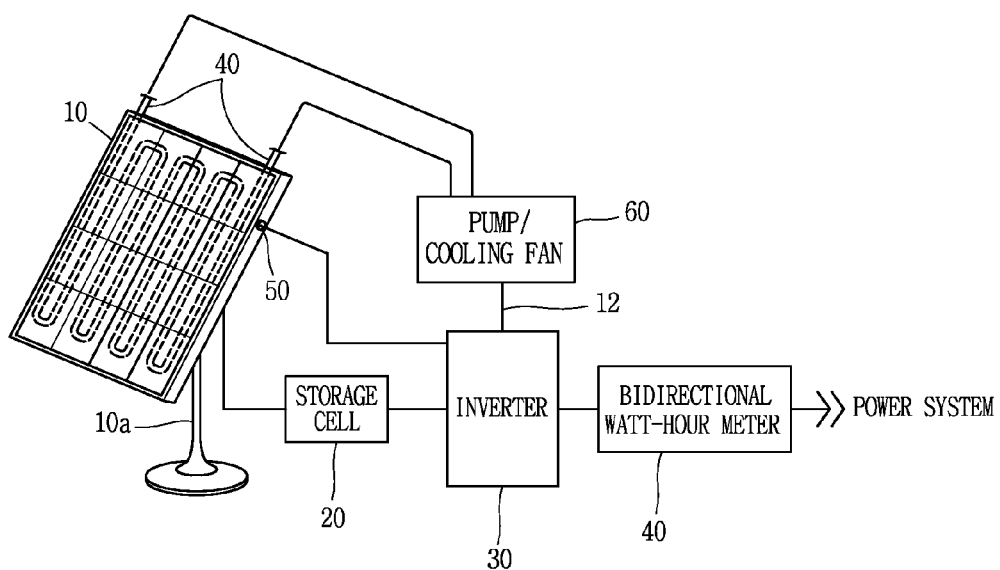
FIG. 2 is a view illustrating a configuration of a temperature controlling system for a solar cell module according to one embodiment of the present invention.

Referring to FIG. 2, reference numeral 10 designates a solar cell module, reference numeral 10a designates a supporting frame which supports the solar cell module 10, and reference numeral 12 designates a signal line for signal-connection between the inverter 30 and other elements. Reference numeral 20 designates a storage cell for charging electric energy provided from the solar cell module 10. Reference numeral 40 designates a watt-hour meter capable to measure an electric power supply amount of an alternating current provided from the inverter 30 for supplying to a commercial power system and an electric power usage amount of a commercial alternating current provided from the commercial power system.

Referring to FIG. 2, a power system means a power line of a commercial alternating current such as an alternating current 220 Volts provided from an electric power supplying company.

The temperature sensor 50 is installed at the solar cell module 10, and is configured to measure temperature of the solar cell module 10 and to provide a temperature measuring signal as an electric signal representing the measured temperature. As the temperature sensor 50, one of various temperature sensors including a platinum resistance temperature detector, a thermistor, a thermocouple, a Resistor Temperature Detector (abbreviated as RTD hereinafter), etc. may be selectively used.

The temperature measuring signal of the solar cell module 10, which has been measured by the temperature sensor 50 to thus be output, may be transmitted to the inverter 30 through a signal line.

The fluid tube 40 is installed to contact a rear surface of the solar cell module 10, and has therein a path along which a temperature controlling fluid flows. The temperature controlling fluid serving as a cooling fluid may be water, an anti-freezing solution, or other fluid.

The pump 60 is connected to the fluid tube 40, and supplies the temperature controlling fluid which flows through the fluid tube 40. For driving or stopping of the pump 60, the pump 60 is electrically connected to the inverter 30. An electric power source of the pump 60 may be provided from the commercial AC electric power source.

The inverter 30 is connected to the solar cell module 10, and is basically configured to convert a direct current provided from the solar cell module 10 into an alternating current.

The inverter 30 is electrically connected to the temperature sensor 50 and the pump 60 through signal lines, for example. The inverter is also configured to compare a current temperature of the solar cell module 10 measured by the temperature sensor 50 (refer to Tdetec of FIG. 4), with a pre-stored first pump driving reference temperature (refer to Tref1 of FIG. 4). If the current temperature (Tdetec) of the solar cell module 10 is not lower than the pre-stored first pump driving reference temperature (Tref1), the inverter 30 drives the pump 60 by outputting a driving control signal for supply of a temperature controlling fluid.

Figure 6:
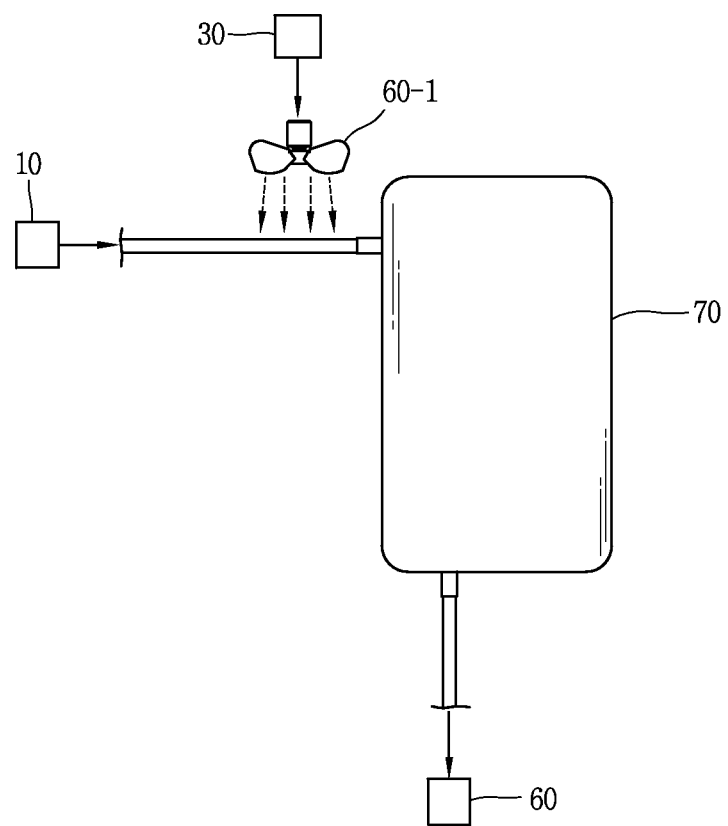
FIG. 6 is a view illustrating an example of an installation position of a cooling fan, in a temperature controlling system for a solar cell module according to one embodiment of the present invention.
Figure 7:
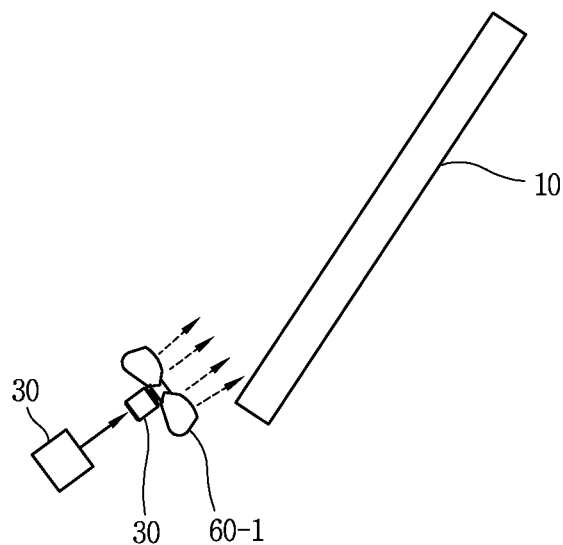
FIG. 7 is a view illustrating another example of an installation position of a cooling fan, in a temperature controlling system for a solar cell module according to one embodiment of the present invention.
Figure 8:
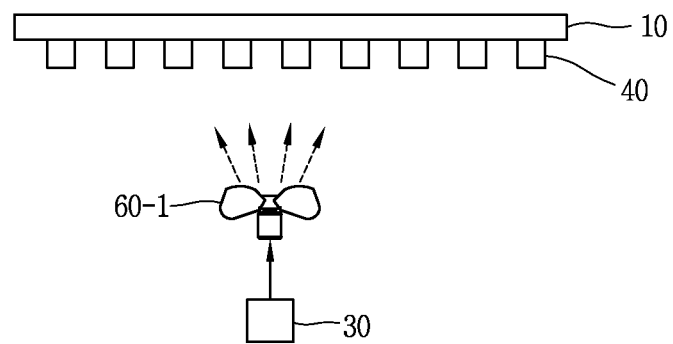
FIG. 8 is a view illustrating still another example of an installation position of a cooling fan, in a temperature controlling system for a solar cell module according to one embodiment of the present invention.

The temperature control system for a solar cell module according to one embodiment of the present invention may further comprise a cooling fan 60-1 as shown in FIGS. 6 to 8.

The cooling fan 60-1 is electrically connected to the inverter 30 through a signal line, for example, so as to be controlled by the inverter 30. When driven by the inverter 30, the cooling fan 60-1 blows a cooling air current.

According to one embodiment, as shown in FIG. 6, the cooling fan 60-1 may be installed to blow a cooling air current toward a portion of the fluid tube 40 through which the cooling fluid returns to the pump 60, so that a returning temperature controlling fluid can be cooled.

According to another embodiment, as shown in FIG. 7, the cooling fan 60-1 may be installed to blow a cooling air current toward the solar cell module 10, so that the solar cell module 10 can be directly cooled. In order to prevent a shadow due to the cooling fan 60-1 from occurring on the solar cell module 10, the cooling fan 60-1 is installed to blow a cooling air current from a lower side to an upper side of the solar cell module 10, toward a front surface of the solar cell module 10.

According to still another embodiment, as shown in FIG. 8, the cooling fan 60-1 may be installed to blow a cooling air current toward the fluid tube 40 provided on a rear surface of the solar cell module 10, so that the solar cell module 10 can be indirectly cooled.

Figure 3:
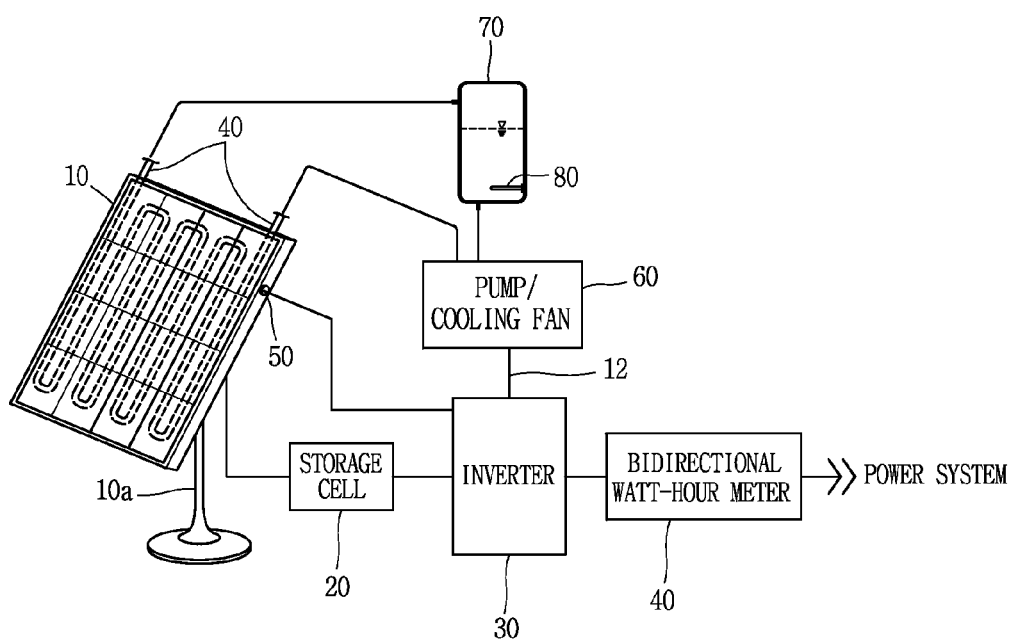
FIG. 3 is a view illustrating a configuration of a temperature controlling system for a solar cell module according to another embodiment of the present invention.

A configuration of a temperature control system for a solar cell module according to another embodiment of the present invention will be explained in more detail with reference to FIG. 3.

The temperature control system for a solar cell module according to another embodiment of the present invention comprises a temperature sensor 50, a fluid tube 40, a pump 60, an inverter 30, a fluid return tank 70 and a heater 80.

The temperature sensor 50, the fluid tube 40 and the pump 60 of the temperature control system for a solar cell module according to another embodiment of the present invention have the same function and configuration as those of the aforementioned embodiment. Thus detailed explanations thereof will be omitted. Rather, a function and a configuration of the inverter 30, the fluid return tank 70 and the heater 80 differentiated from those of the aforementioned embodiment will be explained.

The temperature control system for a solar cell module according to another embodiment of the present invention is configured to raise temperature of the solar cell module 10 into a proper value, in a case where the temperature of the solar cell module 10 has lowered to a value lower than a reference temperature.

Figure 5:
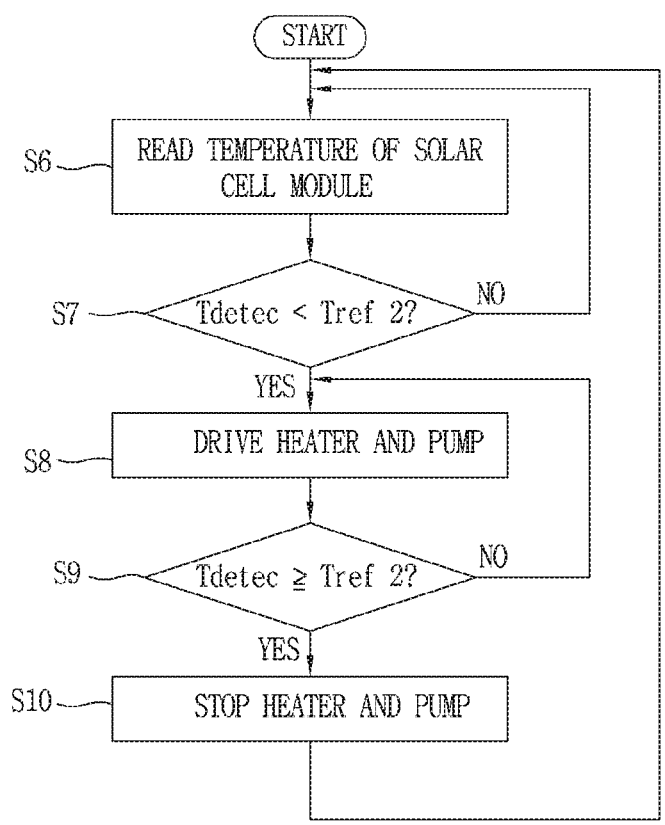
FIG. 5 is a flow chart illustrating a control method by an inverter in a temperature controlling system for a solar cell module according to one embodiment of the present invention, which shows a method of heating a solar cell module.

The inverter 30 is configured to compare a current temperature of the solar cell module 10 measured by the temperature sensor 50 (refer to Tdetec of FIG. 5), with a pre-stored second pump driving reference temperature (refer to Tref2 of FIG. 5). If the current temperature (Tdetec) of the solar cell module 10 is not higher than the pre-stored second pump driving reference temperature (Tref2), the inverter 30 may drive the pump 60 so that a temperature controlling fluid can be supplied, and may drive the heater 80.

The temperature controlling fluid serving as a heating fluid may be heated water, an anti-freezing solution, or other fluid.

The fluid return tank 70 is configured to collect therein the temperature controlling fluid collected from the fluid tube 40 provided on a rear surface of the solar cell module 10, and is configured to be connected to the pump 60. The fluid return tank 70 is connected to a return side and a supplying side of the fluid tube 40.

The heater 80 is installed in or near the fluid return tank 70, and is configured to heat the temperature controlling fluid inside the fluid return tank 70. The heater 80 is electrically connected to the inverter 30 so as to be driven or stopped.

Figure 4:
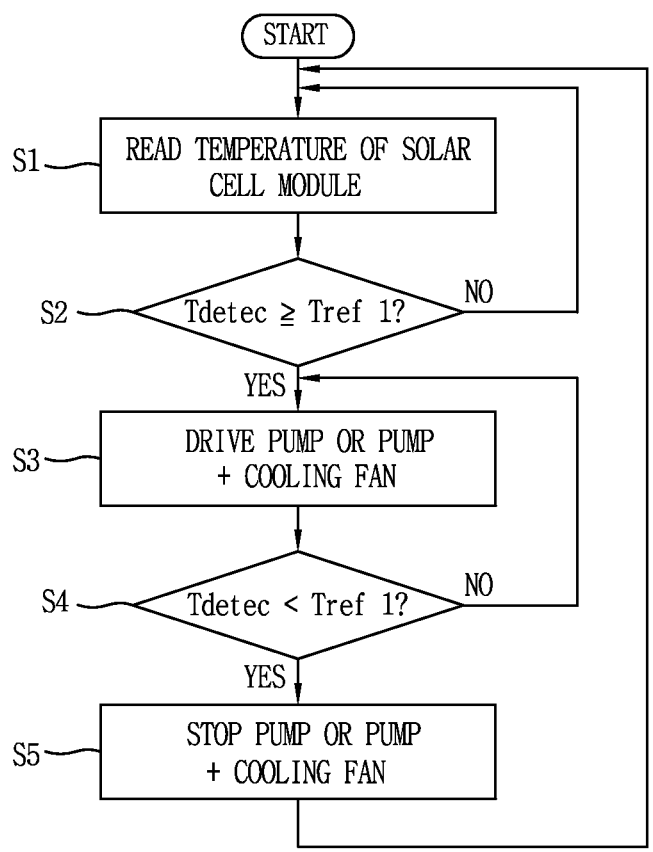
FIG. 4 is a flow chart illustrating a control method by an inverter in a temperature controlling system for a solar cell module according to one embodiment of the present invention, which shows a method of cooling a solar cell module.

An operation of the temperature control system for a solar cell module according to the present invention will be explained with reference to main FIGS. 4 and 5, and with reference to FIGS. 2 and 3.

Hereinafter, a method of cooling a solar cell module by an inverter in a temperature controlling system for a solar cell module according to one embodiment of the present invention, will be explained with reference to main FIG. 4 and auxiliary FIG. 2.

At step S1, the inverter 30 reads a current temperature (Tdetec) of the solar cell module 10 measured by the temperature sensor 50.

Then the inverter 30 compares the current temperature (Tdetec) of the solar cell module 10 measured by the temperature sensor 50, with a pre-stored first pump driving reference temperature (Tref1) (step S2).

If the current temperature (Tdetec) of the solar cell module 10 is not lower than the pre-stored first pump driving reference temperature (Tref1) as a comparison result in step S2, step S3 is performed. On the other hand, if the current temperature (Tdetec) of the solar cell module 10 is lower than the pre-stored first pump driving reference temperature (Tref1) as a comparison result in step S2, step S1 is repeatedly performed.

At step S3, the inverter 30 outputs a driving control signal for supply of a temperature controlling fluid, thereby driving the pump 60. The inverter 30 may supply a temperature controlling fluid and may cool the solar cell module 10 or the temperature controlling fluid, by driving the pump 60 and the cooling fan.

At step S4, the inverter 30 re-compares the current temperature (Tdetec) of the solar cell module 10 measured by the temperature sensor 50, with the pre-stored first pump driving reference temperature (Tref1).

If the current temperature (Tdetec) of the solar cell module 10 is lower than the pre-stored first pump driving reference temperature (Tref1) as a comparison result at step S4, step S5 is performed. On the other hand, if the current temperature (Tdetec) of the solar cell module 10 is not lower than, in other words higher than or equal to the pre-stored first pump driving reference temperature (Tref1) as a comparison result at step S4, step S3 is repeatedly performed.

At step S5, the inverter 30 controls the pump 60 or the pump 60 and the cooling fan to be stopped, i.e., stops output of a driving signal, because the solar cell module 10 is in a normalized state as the current temperature (Tdetec) of the solar cell module 10 is lower than the pre-stored first pump driving reference temperature (Tref1).

The operation to cool the solar cell module 10 is completed, and the inverter 30 returns to step S1 to perform the aforementioned steps (S1-S5).

Hereinafter, a method of heating a solar cell module by an inverter in a temperature controlling system for a solar cell module according to one embodiment of the present invention, will be explained with reference to main FIG. 5 and FIG. 3.

At step S6, the inverter 30 reads a current temperature (Tdetec) of the solar cell module 10 measured by the temperature sensor 50.

Then the inverter 30 compares the current temperature (Tdetec) of the solar cell module 10 measured by the temperature sensor 50, with a pre-stored second pump driving reference temperature (Tref2) (S7).

If the current temperature (Tdetec) of the solar cell module 10 is lower than the pre-stored second pump driving reference temperature (Tref2) as a comparison result at step S7, step S8 is performed. On the other hand, if the current temperature (Tdetec) of the solar cell module 10 is not lower than, that is higher than or equal to the pre-stored second pump driving reference temperature (Tref2) as a comparison result in S7, S6 is repeatedly performed.

At step S8, the inverter 30 may drive the pump 60 to supply a temperature controlling fluid, and may drive the heater 80 to heat the temperature controlling fluid.

At step S9, the inverter 30 re-compares the current temperature (Tdetec) of the solar cell module 10 measured by the temperature sensor 50, with the pre-stored second pump driving reference temperature (Tref2).

If the current temperature (Tdetec) of the solar cell module 10 is not lower than, that is higher than or equal to the pre-stored second pump driving reference temperature (Tref2) as a comparison result at step S9, step S10 is performed. On the other hand, if the current temperature (Tdetec) of the solar cell module 10 is lower than the pre-stored second pump driving reference temperature (Tref2) as a comparison result at step S9, step S8 is repeatedly performed. That is, the inverter 30 may drive the pump 60 to supply a temperature controlling fluid, and may drive the heater 80 to heat the temperature controlling fluid.

At step S10, the inverter 30 controls the pump 60 and the heater 80 so as to be stopped, i.e., stops output of a driving signal, because the solar cell module 10 is in a normalized state as the current temperature (Tdetec) of the solar cell module 10 is not lower than, that is equal to or higher than the pre-stored second pump driving reference temperature (Tref2).

The operation to raise the temperature of the solar cell module 10 is completed, and the inverter 30 returns to step S6 to perform the aforementioned steps (S6-S10).

The temperature control system for a solar cell module according to the present invention comprises a fluid tube installed on a rear surface of the solar cell module; a temperature sensor installed at the solar cell module; and an inverter configured to drive a pump so that a temperature controlling fluid can be supplied, in a case where temperature of the solar cell module is not lower than the pre-stored first pump reference temperature, or in a case where the temperature of the solar cell module is not higher than the pre-stored second pump reference temperature. By the inverter, the temperature of the solar cell module can be properly controlled. Thus, photovoltaic efficiency of the solar cell module can be optimized.

Further, the temperature control system for a solar cell module according to the present invention further comprises a cooling fan for blowing a cooling air current. Thus, when the temperature of the solar cell module is not lower than the pre-stored first pump reference temperature, the temperature of the solar cell module can be lowered more rapidly.

In the temperature control system for a solar cell module according to the present invention, the cooling fan is installed to blow a cooling air current toward the fluid tube which returns to the pump, so that a returning temperature controlling fluid can be cooled. Alternatively, the cooling fan is installed to blow a cooling air current toward the solar cell module, so that the solar cell module can be directly cooled. Still alternatively, the cooling fan is installed to blow a cooling air current toward the fluid tube provided on a rear surface of the solar cell module, so that the solar cell module can be cooled from the rear surface.

In the temperature control system for a solar cell module according to the present invention, the temperature controlling fluid is a cooling fluid or a heating fluid. Thus, the solar cell module, which has a temperature exceeding a reference value, can be cooled by a cooling fluid. On the contrary, the solar cell module, which has a temperature lower than a reference value, can be heated by a heating fluid.

In the temperature control system for a solar cell module according to the present invention, the temperature controlling fluid is configured by an anti-freezing solution. This can prevent damage of the fluid tube due to freezing of the temperature controlling fluid, even in winter, when the solar cell module is exposed to outside.

The temperature control system for a solar cell module according to the present invention comprises a fluid return tank configured to collect therein a returning temperature controlling fluid; and a heater configured to heat the temperature controlling fluid inside the fluid return tank. Under such configuration, the temperature controlling fluid can be collected in the fluid return tank to thus be heated by the heater, and then can be supplied to the solar cell module for heating into a proper temperature.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. A temperature control system for a solar cell module, the system comprising:
    a temperature sensor installed at the module, the temperature sensor configured to measure a temperature of the module;
    a fluid tube installed to contact a rear surface of the module, the fluid tube including a path via which temperature controlling fluid flows;
    a pump connected to the fluid tube, the pump configured to supply the temperature controlling fluid to the rear surface of the module via the fluid tube; and
    an inverter connected to the module and electrically connected to the temperature sensor and the pump, the inverter configured to:
    convert direct current provided from the module into an alternating current;
    compare a current measured temperature of the module to a pre-stored first reference temperature and a pre-stored second reference temperature; and
    control the pump to supply the temperature controlling fluid to lower the temperature of the module if the current measured temperature is not lower than the pre-stored first reference temperature and to control the pump to supply the temperature controlling fluid to raise the temperature of the module if the current measured temperature is not higher than the pre-stored second reference temperature.

2. The system of claim 1, further comprising a fan electrically connected to the inverter and configured to provide cooling air current,
    wherein the inverter is further configured to control the fan to provide the cooling air current when the current measured temperature is not lower than the pre-stored first reference temperature.

3. The system of claim 2, wherein the fan is positioned to provide the cooling air current toward a portion of the fluid tube via which the temperature controlling fluid returns to the pump in order to lower the temperature of the temperature controlling fluid.

4. The system of claim 2, wherein the fan is positioned to provide the cooling air current toward the module in order to directly lower the temperature of the module.

5. The system of claim 2, wherein the cooling fan is positioned to provide the cooling air current toward the fluid tube in order to indirectly lower the temperature of the module.

6. The system of claim 1, wherein:
    the temperature controlling fluid is a cooling fluid when the current measured temperature is not lower than the pre-stored first reference temperature; and
    the temperature controlling fluid is a heating fluid when the current measured temperature is not higher than the pre-stored second reference temperature.

7. The system of claim 6, wherein the temperature controlling fluid is an anti-freezing solution.

8. The system of claim 1, further comprising:
a fluid return tank connected to the pump and configured to collect the temperature controlling fluid that returns to the pump; and
a heater configured to heat the temperature controlling fluid collected by the fluid return tank,
wherein the inverter is further configured to control the heater to increase a temperature of the collected fluid and control the pump to supply the increased temperature fluid to the module if the current measured temperature is still not higher than the pre-stored second reference temperature.

9. The system of claim 1, wherein the temperature sensor is a platinum resistance temperature detector, a thermistor, a thermocouple or a Resistor Temperature Detector.

10. The system of claim 1, wherein the inverter is further configured to control the pump to no longer supply the temperature controlling fluid when the current measured temperature is lower than the pre-stored first reference temperature or higher than the pre-stored second reference temperature.

* * * * *